United States Patent
Breems et al.

(10) Patent No.: US 7,605,733 B2
(45) Date of Patent: Oct. 20, 2009

(54) RADIO FREQUENCY ΣΔ-MODULATOR

(75) Inventors: Lucien Johannes Breems, Eindhoven (NL); Dominicus Martinus Wilhelmus Leenaerts, Riethoven (NL)

(73) Assignee: NXP B.V., Eindhoven (NL)

( * ) Notice: Subject to any disclaimer, the term of this patent is extended or adjusted under 35 U.S.C. 154(b) by 18 days.

(21) Appl. No.: 12/097,097

(22) PCT Filed: Dec. 11, 2006

(86) PCT No.: PCT/IB2006/054733
§ 371 (c)(1),
(2), (4) Date: Jun. 12, 2008

(87) PCT Pub. No.: WO2007/069178
PCT Pub. Date: Jun. 21, 2007

(65) Prior Publication Data
US 2009/0002211 A1    Jan. 1, 2009

(30) Foreign Application Priority Data
Dec. 13, 2005    (EP) .................... 05112001

(51) Int. Cl.
*H03M 3/02*    (2006.01)

(52) U.S. Cl. .................... 341/143
(58) Field of Classification Search ............ 341/143, 341/144, 155
See application file for complete search history.

(56) References Cited

U.S. PATENT DOCUMENTS

| | | | | |
|---|---|---|---|---|
| 5,103,228 A | * | 4/1992 | Voorman et al. | 341/143 |
| 6,121,910 A | * | 9/2000 | Khoury et al. | 341/143 |
| 6,320,529 B1 | * | 11/2001 | Yasuda | 341/155 |
| 2003/0080888 A1 | * | 5/2003 | Muhammad et al. | 341/143 |
| 2005/0179487 A1 | * | 8/2005 | Lee et al. | 330/10 |

FOREIGN PATENT DOCUMENTS

WO    2005002059 A1    1/2005

* cited by examiner

Primary Examiner—Howard Williams

(57) ABSTRACT

A radio-frequency ΣΔ-modulator comprises a first mixer in the forward path for down-converting the signals in this forward path with a local oscillator frequency and a second mixer in the feedback path for up-converting the feedback signal with the same local oscillator frequency. Delays between the two mixing operations cause a loss of gain in the loop of the ΣΔ-modulator. An adjustable amplifier in the feedback path compensates for this loss of gain.

3 Claims, 2 Drawing Sheets

RADIO FREQUENCY ΣΔ-MODULATOR

Figure 1:
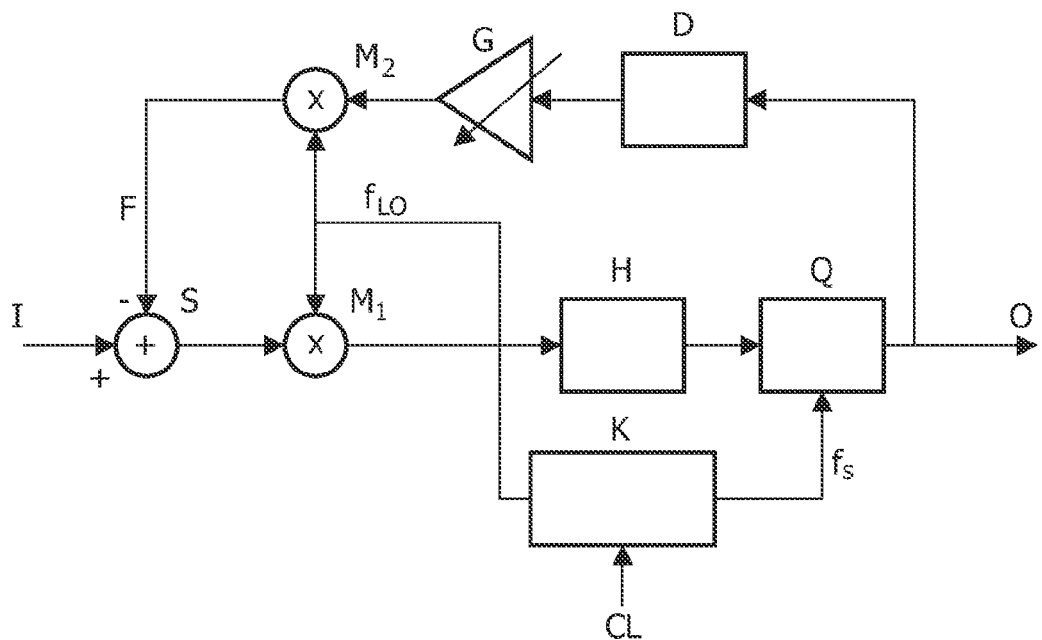

The invention relates to a radio-frequency ΣΔ-modulator (sigma-delta modulator) with a feed-forward path and a feed-back path, the feed-forward path comprising a summing node for summing an analog input signal and a feedback signal of the feedback path and creating therefrom an RF (radio frequency) error-signal, a first mixer receiving said RF error-signal and a local oscillator frequency for down-converting said error-signal, a noise shaping low pass filter for low pass filtering the down-converted error-signal of the first mixer and a quantizer receiving the output signal of the low pass filter and generating therefrom a digital output signal of the ΣΔ-modulator, the feedback path comprising a DA-converter (digital-to-analog converter) and a second mixer driven by said local oscillator frequency for generating an up-converted analog feedback signal.

Such radio frequency ΣΔ-modulator is known from U.S. Pat. No. 6,320,529 FIG. 15. Modern state of the art RF-receivers employ low-IF or zero-IF architectures in order to enable digitization of the receiver chain. In such a concept the receiver chain may consist of a low-noise amplifier, a down mixer, a low-IF or low-pass filter and an AD-converter (analog-to-digital converter). For the AD-conversion ΣΔ-modulators are very suitable thanks to their high resolution and their linearity performance. Moreover the loop filter of the ΣΔ-modulator may also act as a channel selection filter so that an additional IF-filter in front of the AD converter can be eliminated. A continuous time implementation of the ΣΔ-modulator also removes the anti-aliasing filter. The next step of increasing the performance of such receiver is to bring the down-mixer inside the loop of the ΣΔ-modulator with the benefit to improve the linearity of the frequency translation. For loop stability a second mixer is placed in the feedback path of the ΣΔ-modulator. The same local oscillator drives both mixers.

A problem, which is encountered with the above-described ΣΔ-modulator, is that in practice the signal to noise and distortion ratio (SNDR) of the arrangement is substantially lower than in a similar ΣΔ-modulator without the first and second mixers. More specifically, in case there is no mixing action taken place in the loop, an SNDR of for instance 78.8 dB may be observed, whereas with the two mixers driven by a local oscillator of e.g. 5,248 GHz an SNDR of 72.4 dB may be obtained.

It is inter alia an object of the invention to mitigate or substantially reduce this deterioration of the SNDR ratio of the above defined ΣΔ-modulator and the radio frequency ΣΔ-modulator. To this end the invention provides a radio-frequency ΣΔ-modulator as defined in the opening paragraph, characterized in that the feedback path comprises an amplifier with adjustable amplification factor for compensating the loss of amplification caused by delays and/or aspect ratio deviations of the local oscillator drives of the first and second mixers.

The invention is based upon the following consideration: In the ideal case the oscillator drives of the two mixers are perfectly synchronized and have a 50% aspect ratio. In that case the first and second mixers multiply the signal with a factor $M_1$ and $M_2$ respectively that alternate between +1 and −1 so that the product $M_1.M_2$ is always constant and equal to 1. However in practice the delay between the two oscillator drives and also the aspect ratios of these oscillator drives may deviate from each other with the result that the loop gain of the modulator contains a factor $M_1.M_2$ whose mean value is lesser than 1 and which also contains higher (even) harmonic components of the oscillator frequency.

It has been found that especially the reduction of the mean value of the product M1.M2 is responsible for the deterioration of the signal. A reduction of this mean value results in a reduction of the feedback signal and consequently in an increase of the error signal which is delivered by the summing node to the feed-forward path of the ΣΔ-modulator. Therefore the components of this feed-forward path and especially the noise shaping low pass filter are over-excited, which cause the decrease of the SNDR. The amplifier with adjustable amplification factor, that is included in the feedback path of the ΣΔ-modulator, compensates for this loss of amplification and therefore improves the SNDR to a value of e.g. 78 dB.

The RF ΣΔ-modulator may further be characterized by means to insert a reference signal in the feed-forward path during a calibration mode, means to measure during the calibration mode the effect of said reference signal in the digital output signal of the ΣΔ-modulator and to calculate a gain control signal therefrom, and means to apply said gain control signal to the adjustable amplifier for adjusting its gain during normal operational mode of the ΣΔ-modulator. The adjustment of said amplifier occurs then automatically e.g. each time when the ΣΔ-modulator is switched into operation.

The harmonics of the local oscillator frequency in the product $M_1.M_2$ give hardly any performance loss. This because the local oscillator frequency is usually much higher than the sample frequency with which the quantizer of the ΣΔ-modulator operates. The quantization noise spectrum is a repetitive spectrum at multiples of the sampling frequency and shaped with the sinc function. Consequently the noise is already attenuated with some 40 dB at the local oscillator frequency and still more at twice the local oscillator frequency. Thus the leakage of quantization noise at the harmonics of the LO frequency to the baseband is very small.

The performance of the ΣΔ-modulator can further be improved by maintaining a fixed integer ratio between the local oscillator frequency and the sampling frequency at which the quantizer and the DA-converter operate. With this measure the LO-carrier is exactly in a notch of the quantization noise spectrum so that additional noise leakage suppression is obtained. This measure implies that, when the local oscillator frequency varies for tuning the ΣΔ-modulator to different channels, also the sampling frequency of the digital output signal varies.

Figure 2:
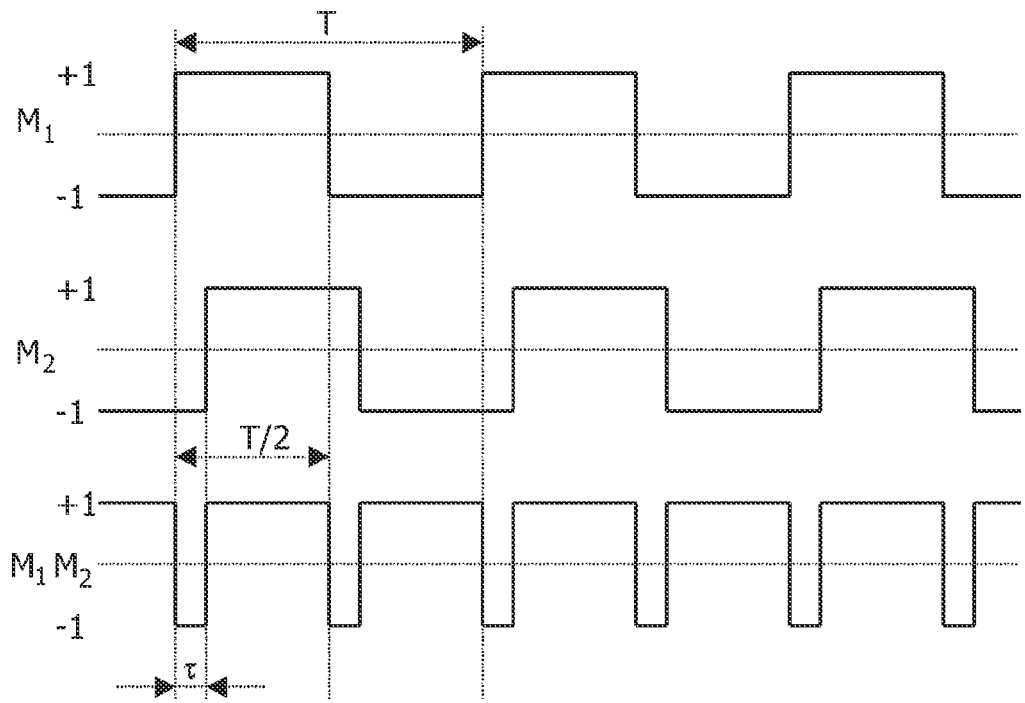

The invention will be further explained with reference to the accompanying figures. Herein shows:

FIG. 1 a first embodiment of an RF ΣΔ-modulator according to the invention,

FIG. 2 curves for explaining the operation of the invention and

Figure 3:
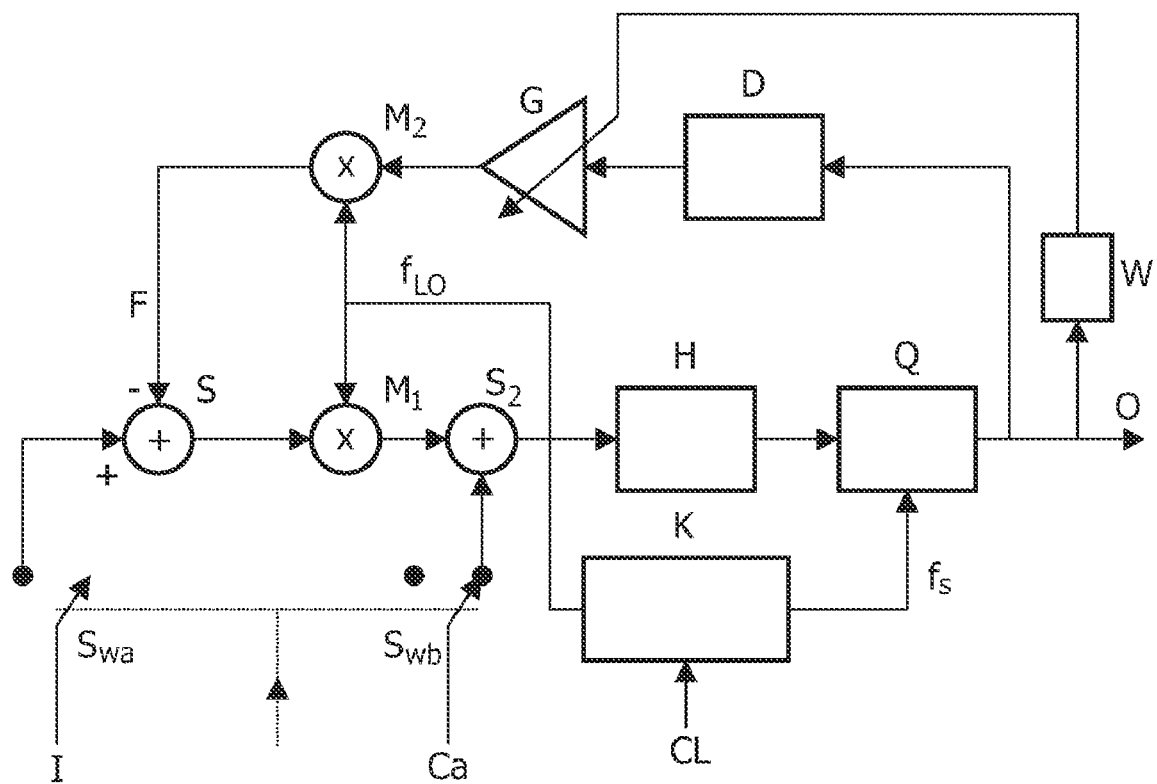

FIG. 3 a second embodiment of an RF ΣΔ-modulator according to the invention.

The RF ΣΔ-modulator of FIG. 1 comprises a summing node S to a +input of which an analog RF input signal I is applied. An analog RF feedback signal F is applied to a −input of the summing node S. The difference between these two signals constitutes an RF error signal that is fed to a mixer $M_1$ where the RF error signal is down-converted to a baseband error signal by means of a local oscillator frequency $f_{LO}$. It may be noted that in this application the term "baseband" is not only intended to mean a demodulated low frequency signal but may also include a zero IF, low IF or other kind of IF signal.

The baseband error signal is subsequently applied to a low-pass or band-pass filter H that serves the usual noise shaping function of the ΣΔmodulator. The so filtered signal is quantized in a quantizer Q at sample rate $f_s$. The quantizer Q may e.g. be a 4 bit quantizer that delivers the 4-bit digital output signal O. A DA converter D serves to derive an analog equivalent of the digital output signal O and this analog equivalent is subsequently up-converted in a second mixer $M_2$ to the RF feedback signal that is applied to the −input of the summing node S. The feedback signal is up-converted with the same local oscillator frequency $f_{LO}$ as is used to down-convert the error signal.

As an example the RF ΣΔmodulator may be used in a receiver chain for signals according to the 802.11a standard. In this case the RF band ranges from 5.15 GHz to 5.35 GHz and comprises 8 channels with 20 MHz channel spacing plus guard spacing.

The arrangement of FIG. 1 further comprises a frequency synthesizer K for generating the local oscillator frequency $f_{LO}$. The frequency synthesizer preferably also generates the sampling frequency $f_s$ by dividing the local oscillator frequency by a fixed integer, which may be a power of 2. For the example given above the divisor may be equal to 32. The result is that the sampling frequency varies, dependent on the tuning, between about 160.9 MHz and 167.2 MHz. This variation of the sampling frequency of ±2% is quite acceptable.

The mixer $M_1$ serves to down-convert the RF error signal to baseband. In contradistinction, the mixer $M_2$ up-converts the baseband feedback signal again to RF and basically serves to improve the stability of the loop. Ideally the product $M_1.M_2$ of the two mixing operations equals 1. However, with the high frequencies involved, a delay between the two local oscillator mixing signals that are active in the mixers, is practically unavoidable. This delay between the mixing signals results in that the product $M_1.M_2$ is a pulse train at twice the local oscillation rate. This is illustrated in FIG. 2.

In this figure both the mixing signals $M_1$ and $M_2$ have a perfect duty cycle of 50%, but the signal $M_2$ has a delay $\tau$ with respect to the signal $M_1$. The LO-period of the two mixers is denoted by T. The curve $M_1.M_2$ represents the mixing product signal to which the signal in the loop is subjected. It is shown that the product signal has a period T/2, equals 1 during a first part T/2−$\tau$ and equals −1 during the remaining part $\tau$ of the period T/2. In this case the DC (mean) value of the product signal $M_1.M_2$ is equal to 1−4.$\tau$/T, so that apparently the gain in the loop is reduced by this factor 1−4.$\tau$/T. The result is that the RF feedback signal supplied to the summing node S is too small so that the error signal supplied by the summing mode is too large and the input of the low pass filter H becomes overdriven. To compensate for this loss of gain the arrangement of FIG. 1 contains an adjustable amplifier G between the DA-converter D and the second mixer $M_2$. The gain of this amplifier is then preferably set to 1/(1−4.$\tau$/T). For instance when the delay $\tau$ is 5% of the period T the gain of the amplifier G is adjusted to approximately 1.25 and when the delay is 8% this gain is adjusted to approximately 1.47. The AC components of the mixer-product consist of even harmonics of the local-oscillator frequency. They may cause quantization noise transposed to the baseband. However this effect may be held small enough if the ratio between the local oscillator frequency $f_{LO}$ and the sampling frequency $f_s$ is a sufficiently large integer (e.g. 32).

When the two mixing signals $M_1$ and $M_2$ are perfectly synchronized but have different duty cycles, the gain is reduced by the factor 1−2.$\tau$/T, where $\tau$ is now the difference in pulse length between the two mixer signals. The amplifier G should then have a gain of about 1/(1−2.$\tau$c/T).

In the ΣΔ-modulator of FIG. 3 the adjustment of the gain of the amplifier G is automated. For that purpose the arrangement comprises two switch sections Swa and Swb for switching the arrangement between a normal mode and a calibration mode. During the calibration mode the input signal I is disconnected from the +input of the summing node S and a known DC calibration offset Ca is added by means of a second summing node $S_2$ to the feed-forward path between the mixer $M_1$ and the quantizer Q. The ΣΔ-modulator digitizes the calibration offset however with gain loss due to the delay between the mixing signals $M_1$ and $M_2$. With the known calibration offset signal, it is known what the offset signal in the digital output should be in the ideal case that the product $M_1.M_2$ equals 1. Due to the gain loss caused by the delay, a different DC value in the output code is obtained. This difference is calculated in a digital gain calculator W and is used to control the gain of the amplifier G during the normal mode.

It may be observed that various modifications on the arrangements shown in the figures may be made. For instance the mixers $M_1$ and $M_2$ may be quadrature (complex) mixers wherein the signal is mixed with two 90° phase shifted local oscillator waves. In another modification the amplifier G may be positioned in the output of the mixer $M_2$. Further the mixer $M_2$ may be in the digital domain i.e. prior to the DA converter D. In that case the DA converter has to be operated at the rate of the oscillator-frequency.

In summary the invention relates to a radio-frequency ΣΔ-modulator comprises a first mixer in the forward path for down-converting the signals in this forward path with a local oscillator frequency and a second mixer in the feedback path for up-converting the feedback signal with the same local oscillator frequency. Delays between the two mixing operations cause a loss of gain in the loop of the ΣΔ-modulator. An adjustable amplifier in the feedback path compensates for this loss of gain.

The invention claimed is:

1. A radio-frequency Sigma Delta (ΣΔ) modulator with a feed-forward path and a feedback path, the feed-forward path comprising a summing node for summing an analog input signal and a feedback signal of the feedback path and creating therefrom an RF error-signal, a first mixer receiving said RF error-signal and a local oscillator frequency for down-converting converting said error-signal, a noise shaping low pass filter for low pass filtering the down-converted error-signal of the first mixer and a quantizer receiving the output signal of the low pass filter and generating therefrom a digital output signal of the ΣΔ-modulator, the feedback path comprising a DA-converter and a second mixer driven by said local oscillator frequency for generating an up-converted analog feedback signal, characterized in that the feedback path comprises an amplifier with adjustable amplification factor for compensating the loss of amplification caused by delays and/or aspect ratio deviations of the local oscillator drives of the first and second mixers.

2. A radio-frequency ΣΔ-modulator as claimed in claim 1 characterized by means to insert a reference signal in the feed-forward path during a calibration mode, means to measure during the calibration mode the effect of said reference signal in the digital output signal of the ΣΔ-modulator and to calculate a gain control signal therefrom, and means to apply said gain control signal to the adjustable amplifier for adjusting its gain during normal operational mode of the ΣΔ-modulator.

3. A radio-frequency ΣΔ-modulator as claimed in claim 1, in which the local oscillator frequency varies for tuning the ΣΔ-modulator to different channels, characterized in that the sampling frequency at which the quantizer operates varies with the oscillator frequency whereby a fixed integer relation between the oscillator frequency and the sampling frequency is maintained.

* * * * *